(12) United States Patent
Forbes et al.

(10) Patent No.: US 8,330,202 B2
(45) Date of Patent: Dec. 11, 2012

(54) GERMANIUM-SILICON-CARBIDE FLOATING GATES IN MEMORIES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 1546 days.

(21) Appl. No.: 11/063,825

(22) Filed: Feb. 23, 2005

(65) Prior Publication Data

US 2006/0186458 A1 Aug. 24, 2006

(51) Int. Cl.
*H01L 29/76* (2006.01)
*H01L 29/788* (2006.01)

(52) U.S. Cl. ........................ 257/315; 257/314
(58) Field of Classification Search .......... 257/314–324, 257/E29.129
See application file for complete search history.

(56) References Cited

U.S. PATENT DOCUMENTS

| | | |
|---|---|---|
| 3,641,516 A | 2/1972 | Castrucci et al. |
| 3,665,423 A | 5/1972 | Nakanuma et al. |
| 4,507,673 A | 3/1985 | Aoyama et al. |
| 4,939,559 A | 7/1990 | DiMaria et al. |
| 5,021,999 A | 6/1991 | Kohda et al. |
| 5,111,430 A | 5/1992 | Morie |
| 5,298,447 A | 3/1994 | Hong |
| 5,457,649 A | 10/1995 | Eichman et al. |
| 5,493,140 A | 2/1996 | Iguchi |
| 5,670,790 A | 9/1997 | Katoh et al. |
| 5,714,766 A | 2/1998 | Chen et al. |
| 5,740,104 A | 4/1998 | Forbes |
| 5,751,038 A | 5/1998 | Mukherjee |
| 5,768,192 A | 6/1998 | Eitan |
| 5,801,401 A | 9/1998 | Forbes |
| 5,852,306 A | 12/1998 | Forbes |
| 5,888,867 A * | 3/1999 | Wang et al. .................. 438/257 |
| 5,973,355 A | 10/1999 | Shirai et al. |
| 5,989,958 A | 11/1999 | Forbes |
| 6,093,606 A | 7/2000 | Lin et al. |
| 6,118,147 A | 9/2000 | Liu |
| 6,124,608 A | 9/2000 | Liu et al. |
| 6,125,062 A | 9/2000 | Ahn et al. |
| 6,130,453 A | 10/2000 | Mei et al. |
| 6,141,260 A | 10/2000 | Ahn et al. |

(Continued)

FOREIGN PATENT DOCUMENTS

JP 03-222367 10/1991

(Continued)

OTHER PUBLICATIONS

Banerjee, S. , "Applications of silicon-germanium-carbon in MOS and bipolar transistors", *Proceedings of the SPIE—The International Society for Optical Engineering*, 3212, (1997), 118-128.

(Continued)

*Primary Examiner* — Cuong Q Nguyen
(74) *Attorney, Agent, or Firm* — Schwegman, Lundberg & Woessner, P.A.

(57) ABSTRACT

The use of a germanium carbide (GeC), or a germanium silicon carbide (GeSiC) layer as a floating gate material to replace heavily doped polysilicon (poly) in fabricating floating gates in EEPROM and flash memory results in increased tunneling currents and faster erase operations. Forming the floating gate includes depositing germanium-silicon-carbide in various combinations to obtain the desired tunneling current values at the operating voltage of the memory device.

25 Claims, 4 Drawing Sheets

U.S. PATENT DOCUMENTS

| | | | |
|---|---|---|---|
| 6,147,378 A | 11/2000 | Liu et al. | |
| 6,166,401 A | 12/2000 | Forbes | |
| 6,180,461 B1 | 1/2001 | Ogura | |
| 6,180,980 B1 | 1/2001 | Wang | |
| 6,246,606 B1 | 6/2001 | Forbes et al. | |
| 6,313,518 B1 | 11/2001 | Ahn et al. | |
| 6,316,298 B1 | 11/2001 | Lee | |
| 6,351,411 B2 | 2/2002 | Forbes et al. | |
| 6,404,681 B1 | 6/2002 | Hirano | |
| 6,476,434 B1 | 11/2002 | Noble et al. | |
| 6,504,207 B1 | 1/2003 | Chen et al. | |
| 6,545,314 B2 | 4/2003 | Forbes et al. | |
| 6,566,682 B2 | 5/2003 | Forbes | |
| 6,586,797 B2 | 7/2003 | Forbes et al. | |
| 6,723,606 B2 | 4/2004 | Flagan et al. | |
| 6,753,568 B1 | 6/2004 | Nakazato et al. | |
| 6,753,571 B2 | 6/2004 | Kim et al. | |
| 6,778,441 B2 | 8/2004 | Forbes et al. | |
| 6,794,250 B2 | 9/2004 | Chang et al. | |
| 6,794,255 B1 | 9/2004 | Forbes et al. | |
| 6,800,895 B2 | 10/2004 | Chang et al. | |
| 6,888,739 B2 | 5/2005 | Forbes | |
| 6,903,367 B2 | 6/2005 | Forbes | |
| 6,950,340 B2 | 9/2005 | Bhattacharyya | |
| 6,952,032 B2 | 10/2005 | Forbes et al. | |
| 7,042,043 B2 | 5/2006 | Forbes et al. | |
| 7,112,841 B2 | 9/2006 | Eldridge et al. | |
| 7,126,183 B2 | 10/2006 | Forbes et al. | |
| 7,135,734 B2 | 11/2006 | Eldridge et al. | |
| 7,153,744 B2 | 12/2006 | Chen et al. | |
| 7,154,778 B2 | 12/2006 | Forbes | |
| 7,163,863 B2 | 1/2007 | Shone | |
| 7,205,601 B2 | 4/2007 | Lee et al. | |
| 2002/0003252 A1 | 1/2002 | Iyer | |
| 2002/0109138 A1 | 8/2002 | Forbes | |
| 2002/0109158 A1 | 8/2002 | Forbes et al. | |
| 2002/0176293 A1 | 11/2002 | Forbes et al. | |
| 2003/0042528 A1 | 3/2003 | Forbes | |
| 2003/0043637 A1 | 3/2003 | Forbes et al. | |
| 2003/0048666 A1 | 3/2003 | Eldridge et al. | |
| 2003/0049900 A1 | 3/2003 | Forbes et al. | |
| 2003/0207032 A1 | 11/2003 | Ahn et al. | |
| 2003/0207540 A1 | 11/2003 | Ahn et al. | |
| 2005/0023595 A1 | 2/2005 | Forbes et al. | |
| 2005/0023602 A1 | 2/2005 | Forbes et al. | |
| 2005/0023603 A1 | 2/2005 | Eldridge et al. | |
| 2005/0024945 A1 | 2/2005 | Forbes | |
| 2005/0026349 A1 | 2/2005 | Forbes et al. | |
| 2005/0199947 A1 | 9/2005 | Forbes | |
| 2006/0001049 A1 | 1/2006 | Forbes | |
| 2006/0002192 A1 | 1/2006 | Forbes et al. | |
| 2006/0170029 A1* | 8/2006 | Liu et al. | 257/315 |
| 2006/0199338 A1 | 9/2006 | Eldridge et al. | |
| 2006/0231886 A1 | 10/2006 | Forbes et al. | |
| 2006/0234450 A1 | 10/2006 | Forbes et al. | |
| 2006/0237768 A1 | 10/2006 | Forbes et al. | |

FOREIGN PATENT DOCUMENTS

| | | |
|---|---|---|
| JP | 06-224431 | 8/1994 |
| JP | 06-302828 | 10/1994 |
| JP | 08-255878 | 10/1996 |

OTHER PUBLICATIONS

Beensh-Marchwicka, G. , et al., "Preparation of thermosensitive magnetron sputtered thin films", *Vacuum*, 53(1-2), (May 1999), 47-52.

Dalal, Vikram L., et al., "Microcrystalline Germanium Carbide—A new material for PV conversion", *Presented at 2001 NCPV Program Review Meeting*, (2001), 348-349.

Herrold, J. , et al., "Growth and properties of microcrystalline germanium-carbide alloys", *Amorphous and Heterogeneous Silicon Thin Films: Fundamentals to Devices—1999 Symposium*, San Francisco, CA, Apr. 5-9, 1999, 561-566.

Herrold, J. , et al., "Growth and properties of microcrystalline germanium-carbide carbide alloys grown using electron cyclotron resonance plasma processing", *Journal of Non-Crystalline Solids (Netherlands)*, 270(1-3), (May 2000), 255-259.

Kouvetakis, J. , et al., "Novel chemical routes to silicon-germanium-carbon materials", *Applied Physics Letters*, 65(23), (Dec. 5, 1994), 2960-2962.

Lopez, E. , et al., "Laser assisted integrated processing of SiGeC films on silicon", *Thin Solid Films*, vol. 453-454, (Apr. 1, 2004), 46-51.

Pavan, Paolo , et al., "Flash Memory Cells—An Overview", *Proc. IEEE*, 85(8), (1997), 1248-1271.

Summonte, C. , et al., "Wide band-gap silicon-carbon alloys deposited by very high frequency plasma enhanced chemical vapor deposition", *Journal of Applied Physics*, 96(7), (Oct. 1, 2004), 3987-3997.

Tyczkowski, J. , et al., "Electronic band structure of insulating hydrogenated carbon-germanium films", *Journal of Applied Physics*, 86(8), (Oct. 15, 1999), 4412-4418.

U.S. Appl. No. 09/945,507, filed Aug. 30, 2001, Flash Memory With Low Tunnel Barrier Interpoly Insulators.

U.S. Appl. No. 09/943,134, filed Aug. 30, 2001, Programmable Array Logic or Memory Devices With Asymmetrical Tunnel Barriers.

U.S. Appl. No. 09/945,512, filed Aug. 30, 2001, In Service Programmable Logic Arrays With Low Tunnel Barrier Interpoly Insulators.

U.S. Appl. No. 09/945,500, filed Aug. 30, 2001, Programmable Memory Address and Decode Circuits With Low Tunnel Barrier Interpoly Insulators.

U.S. Appl. No. 10/028,001, filed Dec. 20, 2001, Programmable Array Logic or Memory With P-Channel Devices and Asymmetrical Tunnel Barriers.

U.S. Appl. No. 10/081,818, filed Feb. 20, 2002, Atomic Layer Deposition of Metal Oxide and/or Low Asymmetrical Tunnel Barrier Interpoly Insulators.

U.S. Appl. No. 10/177,214, filed Jun. 21, 2002, Nanocrystal Write Once Read Only Memory for Archival Storage.

U.S. Appl. No. 10/177,096, filed Jun. 21, 2002, Graded Composition Metal Oxide Tunnel Barrier Interpoly Insulators.

U.S. Appl. No. 10/789,038, filed Feb. 27, 2004, Integrated Circuit Memory Device and Method.

U.S. Appl. No. 10/781,035, filed Feb. 18, 2004, Graded Composition Metal Oxide Tunnel Barrier Interpoly Insulators.

U.S. Appl. No. 10/929,916, filed Aug. 30, 2004, Programmable Array Logic or Memory With P-Channel Devices and Asymmetrical Tunnel Barriers.

U.S. Appl. No. 10/788,810, filed Feb. 27, 2004, In Service Programmable Logic Arrays With Low Tunnel Barrier Interpoly Insulators.

U.S. Appl. No. 10/931,704, filed Sep. 1, 2004, Flash Memory With Low Tunnel Barrier Interpoly Insulators.

U.S. Appl. No. 10/929,986, filed Aug. 30, 2004, Atomic Layer Deposition of Metal Oxide and/or Low Asymmetrical Tunnel Barrier Interpoly Insulators.

U.S. Appl. No. 10/931,711, filed Sep. 1, 2004, Programmable Memory Address and Decode Circuits With Low Tunnel Barrier Interpoly Insulators.

U.S. Appl. No. 10/931,540, filed Aug. 31, 2004, Programmable Array Logic or Memory Devices With Asymmetrical Tunnel Barriers.

Feb. 14, 2005, Nanocrystal Write Once Read Only Memory for Archival Storage.

Dec. 18, 2003, ALD High K Tunnel Dielectrics for Flash Memories.

Apr. 29, 2004, Graded Composition High Dielectric Constant Insulators for Tunnel and Gate Insulators in Flash Memory Devices.

U.S. Appl. No. 11/057,634 non-final office action mailed Dec. 30, 2005, 6 pgs.

U.S. Appl. No. 11/057,634 Response filed May 25, 2006 to non-final office action mailed Dec. 30, 2005, 8 pgs.

\* cited by examiner

GERMANIUM-SILICON-CARBIDE FLOATING GATES IN MEMORIES

TECHNICAL FIELD

This application relates generally to semiconductor devices and device fabrication and, more particularly, to transistor gate materials and their properties, and in particular to floating gate devices.

BACKGROUND

The electronic device industry uses many different types of memory in computers and other electronic systems, such as automobiles and traffic control systems. Different types of memory have different access speeds and different cost per stored bit. For example, items of memory that require rapid recovery may be stored in fast static random access memory (RAM). Information that is likely to be retrieved a very short time after storage may be stored in less expensive dynamic random access memory (DRAM). Large blocks of information may be stored in low cost, but slow access media such as magnetic disk. Each type of memory has benefits and drawbacks, for example DRAMs lose the stored information if the power is shut off. While the magnetic memory can retain the stored information when the power is off (known as non-volatile), the time to retrieve the information is hundreds of times slower than semiconductor memory such as RAM. One type of non-volatile semiconductor memory device is electrically programmable read-only memory (EPROM). There are also electrically-erasable programmable read-only memory (EEPROM) devices. One type of EEPROM is erasable in blocks of memory at one time, and is known as flash memory. Flash memory is non-volatile like magnetic memory, is much faster than magnetic memory like RAM, and is becoming widely used for storing large amounts of data in computers. However, writing information to a conventional flash memory takes a higher write voltage than it does to write information to conventional RAM, and the erase operation in flash requires a relatively long time period.

Conventional EEPROM devices, such as flash memory, may operate by either storing electrons on an electrically isolated transistor gate, known as a floating gate, or not storing electrons on the floating gate. Typically the write (or program) operation and the erase operation are performed by another transistor gate, known as the control gate, which is located above the floating gate. A large positive voltage on the control gate will draw electrons from the substrate through the gate oxide and trap them on the floating gate. The erase operation uses a large negative voltage to drive any stored electrons on the floating gate off of the gate and back into the substrate, thus returning the floating gate to a zero state. This operation may occur through various mechanisms, such as Fowler-Nordheim (FN) tunneling. The rate at which the electrons can be transported through the insulating gate oxide to and from the floating gate is an exponential factor of both the thickness of the insulator and of the electrical height of the insulation barrier between the substrate and the floating gate. Grown gate oxides have great height, and slow tunneling.

Electronic devices have a market driven need to reduce the size and power consumption of the devices, such as by replacing unreliable mechanical memory like magnetic disks, with transistor memory like EEPROM and flash. These increasingly small and reliable memories will likely be used in products such as personal computers (PCs), personal digital assistants (PDAs), mobile telephones, laptop PCs, and even in replacing the slow hard disk drives in full sized computer systems. This is because a solid state device, such as flash memory, is faster, more reliable and has lower power consumption than a complex and delicate mechanical system such as a high speed spinning magnetic disk. What is needed is an improvement in the erase time for EEPROM devices. With improved erase times, the high density of flash memory, and a speed of operation comparable to DRAMs, flash memory might replace both magnetic memory and DRAMs in certain future computer devices and applications.

SUMMARY

The above mentioned problems with memory devices are addressed herein and will be understood by reading and studying the following specification. An embodiment has a floating gate transistor with a gate made of a material having a lower tunneling barrier and thus lower erase times. An embodiment has the floating gate formed of germanium silicon carbide. Another embodiment has the composition of the floating gate determined by a desired tunneling current. Another embodiment includes a transistor with a conventional gate having the composition of the germanium silicon carbide adjusted to optimize the threshold of a metal oxide semiconductor field effect transistor (MOSFET).

An embodiment for a method for forming a floating gate memory device includes forming a floating gate having a lower tunneling barrier by forming the gate of a mixture of germanium, silicon and carbon. Another embodiment includes a method of storing data by setting the voltage of the control gate, drain diffusion and source diffusion to either trap electrons on a floating gate made of germanium, silicon and carbon, or by ejecting trapped electrons from the floating gate by Fowler-Nordheim tunneling.

Applications include structures for transistors, memory devices such as flash, and electronic systems with gates containing a mixture of germanium, silicon and carbon, and methods for forming such structures. These and other aspects, embodiments, advantages, and features will become apparent from the following description and the referenced drawings.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
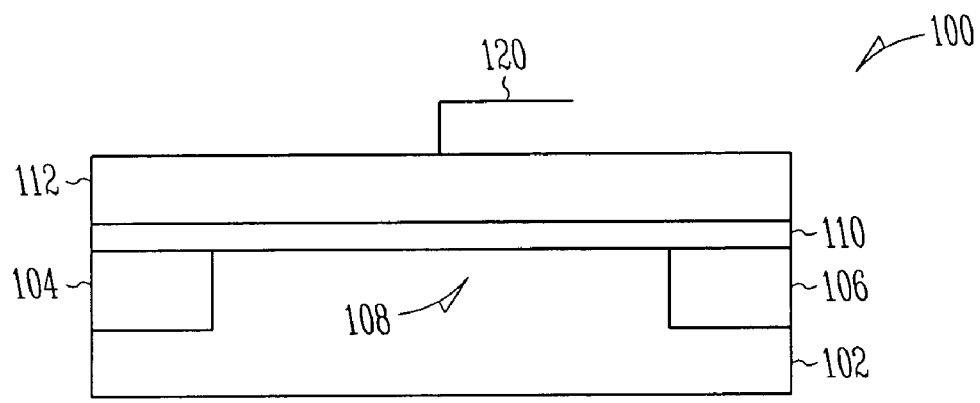
FIG. 1 illustrates a transistor with a germanium silicon carbide gate, according to embodiments of the present subject matter.

Field effect transistors (FETs) are used in many different electronic devices, including memory devices. FETs are used both as access transistors and as memory elements. The structure of a typical FET 100 is shown in FIG. 1, where a lightly doped substrate 102 has a heavily oppositely doped source region 104 and drain region 106. The portion of the substrate 102 located between the source region 104 and the drain region 106 is known as the channel region 108, and may have a doping level that is different from the doping level of the substrate 102, and may even be counter doped to have a doping type opposite of the substrate. The substrate may be either lightly doped P type or N type, and the diffused source and drain regions will be heavily doped with the opposite doping type. There is a gate oxide 110 located over the channel region 108, and making at least some contact with each of the source region 104 and drain region 106. The gate oxide 110 is an insulator, such as thermally grown silicon dioxide, and at normal operating voltages prevents current flow from the substrate 102 to a conductive gate electrode 112. Conductive gate electrode 112 is located on top of the gate oxide 110, and also extends at least some distance over each of the source region 104 and drain region 106. Conventional gate electrodes are formed of doped polycrystalline silicon (poly or polysilicon). Embodiments of the present subject matter form gate electrode 112 with a germanium silicon carbide (GeSiC) composition. In operation, when a signal is directed to the gate 112 over an electrical connection 120, the signal voltage affects the concentration of electrical carriers in the channel region 108. For example, if a positive voltage having a greater value than what is known as the threshold voltage of the transistor 100 is applied to gate 112, then the relatively small number of electrons (negative carriers) in the P type substrate 102 will be attracted to the channel region 108 in great enough numbers to overwhelm the positive holes in the channel region, and thus temporarily convert the channel region to be N type as long as the positive voltage is applied to the gate 112. Thus a large enough positive voltage (known as the threshold voltage) on the gate 112 will electrically connect the source region 104 to the drain region 106 and turn on the transistor 100. The threshold voltage depends upon the thickness and dielectric constant of the gate insulator 110, the doping level of the channel region 108, and the electron affinity of the material forming the gate electrode 112. Thus, a gate electrode made of a material such as GeSiC may have the threshold voltage of the transistor adjusted to a desired level by changing the electron affinity of the transistor, and may thus reduce the number and size of ion implantation adjustments of the channel doping level.

Figure 2:
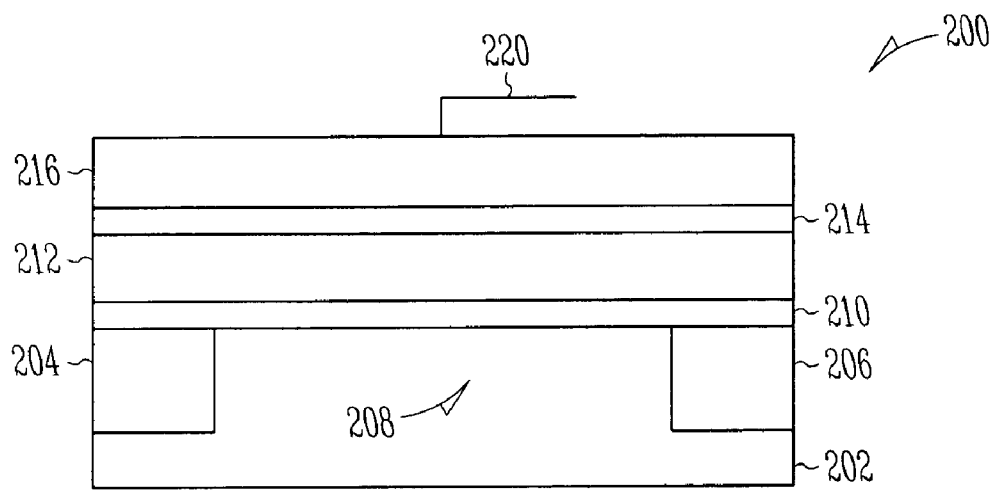
FIG. 2 illustrates a non-volatile memory element with a germanium silicon carbide gate, according to embodiments of the present subject matter.

The illustrative floating gate transistor 200, as shown in FIG. 2, may have a lightly doped substrate 202 with a heavily oppositely doped source region 204 and drain region 206. For example, the substrate 202 may be a lightly doped P type region, and the source region 204 and drain region 206 would then be heavily doped N+ type. The portion of the substrate 202 located between the source region 204 and the drain region 206 is again known as the channel region 208, and may have a doping level that is different from the doping level of the substrate 202. There is a gate oxide 210 located over the channel region 208, which is an insulator such as thermally grown silicon dioxide. There is an electrically floating conductive gate 212, located on top of the gate oxide 210, which unlike the previously discussed transistor 100 of FIG. 1, has no direct connection to signal voltages, and is typically called a floating gate since it is electrically floating. Conventionally, floating gates are typically formed of doped polysilicon. Embodiments of the present subject matter form floating gate 212 with a germanium silicon carbide composition. There is an inter-gate dielectric or insulator 214 which electrically separates the floating gate 212 from a control gate 216, which is also typically made of polysilicon. In operation the control gate is connected to signal voltage 220. The signal voltage 220 must be larger than the signal voltage 120 for the conventional transistor since the control gate is further from the channel region 208 and because the electrons in the channel region must be at a high enough voltage to be injected through the gate oxide 210 to become trapped on floating gate 212. A given signal voltage level will provide a current of electrons through the gate oxide 210 that depends exponentially upon the level of the signal voltage, the thickness of the gate oxide 206 and the electrical height of the barrier formed by the gate oxide 210 between the energy levels of the substrate at the channel 208 and the energy level of the floating gate 212. Changing the material of the substrate 202 or of the floating gate 212 changes the electrical height of the barrier formed by the gate oxide 210, and radically changes the amount of current that tunnels through the gate oxide 206 by means of Fowler-Nordheim tunneling. Thus, changing the tunneling barrier height results in erase operations that have larger currents at a given erase voltage level, and therefore result in faster erase times for memory devices. Another advantage of lowering the tunneling barrier height is that lower erase voltages may be used. Lower erase voltages mean lower electrical fields for a given dielectric thickness, and therefore reduced reliability issues such as time dependent dielectric breakdown of the gate insulator and inter-gate insulator.

Figure 3:
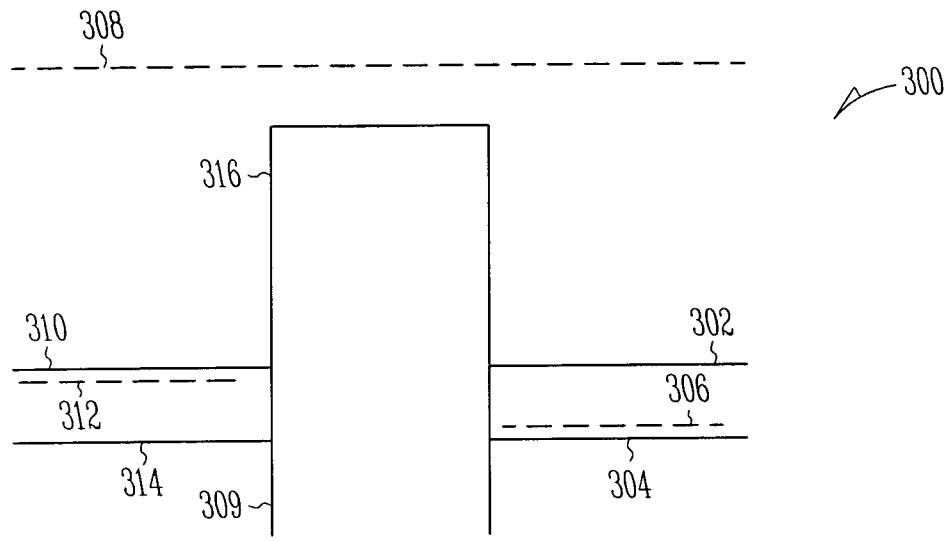
FIG. 3 is an energy band diagram for a polysilicon gate transistor.

The reason that changing the material of the substrate or of the floating gate changes the electrical height of the tunneling barrier is best understood by examination of what is known as an energy band diagram, as shown in FIG. 3 for the typical memory transistor discussed in FIG. 2 and used in flash memory. As noted above, the excellent quality of grown gate oxides results in a large electrical height of the tunneling barrier formed by the oxide. This high quality oxide results in lower programming currents and lower erase currents and causes slower memory operation. An issue with other gate insulators besides grown oxides, such as chemical vapor deposited (CVD) oxides, silicon nitride, aluminum oxide, tantalum oxide, and titanium oxides, is that the results have proven unacceptable from a device electrical performance point of view, including high levels of what are known as surface states. If the surface states are reduced by growing a thin oxide underneath the deposited oxide, then the interface between the two insulators may have large numbers of what are known as trap states, and may have band gap discontinuities and differences in the conductivity of the insulator films. Thus, changing the gate insulator to reduce the tunneling barrier height and voltage may pose problems, particularly with maintaining consistent time-dependent device electrical operation.

Another method of changing the tunneling voltage, and thus equivalently increasing the tunneling current at a particular voltage level, is to change the overall tunneling barrier height by increasing the internal energy level of the conductors on either side of the insulator, rather than by lowering the insulator barrier level. Changing the silicon substrate to some other material may cause numerous practical problems in the fabrication of devices, since so much is known about the use of silicon. Changing the material of the floating gate to a material with what is known as a lower electron affinity, denoted by the lower case Greek letter Chi ($\chi$) results in higher tunneling currents. A lower electron affinity reduces the effective height of the insulator tunneling barrier, which as noted previously has an exponential effect on the amount of tunneling current at a given voltage.

A transistor built on a single crystal silicon substrate has a band gap diagram 300, with a conduction level 302, a valence level 304, and a Fermi level 306, as shown for a lightly doped P type silicon substrate with reference to the vacuum level 308, which represents the amount of energy it would take to remove an electron from the silicon. On the opposite side of a gate oxide 309, heavily doped N type polycrystalline silicon will have a conduction level 310, a Fermi level 312 and a valence level 314. The gate oxide 309 has an energy level value 316, whose difference from the vacuum level 308 represents the electron affinity $\chi$ of the gate oxide, typically thermally grown silicon dioxide. For good quality thermally grown silicon dioxide, the value of $\chi$ is 0.9 eV. For electrons on the floating gate conduction band 310, the value of electron affinity $\chi$ is the difference between 310 and the vacuum level 308, and for doped polysilicon is approximately 4.1 eV. Thus, the barrier that an electron tunneling from the floating gate 212 conduction band 310 to the silicon substrate 202 in the area of the channel 208, must traverse during an erase operation is the height represented by the difference between the top of the gate oxide 316 and the conduction band 310, or 4.1 eV minus 0.9 eV, or about 3.2 eV. As noted previously, the tunneling rate is an exponential factor of the height of the barrier, and the width of the oxide, which is controlled by the process parameter of gate oxide thickness.

The distance between the conduction level 310 and the valence level 314 is known as the band gap, and has a value in silicon of approximately 1.1 eV. Since the value of electron affinity for the gate oxide is not going to change, then the use of a floating gate material that has a larger band gap would result in a lower electron affinity, and thus a reduced tunneling barrier. Changing the electron affinity of the gate material also changes the threshold voltage of the transistor, and may be used in conjunction with channel doping levels and gate insulator thickness and dielectric constant to adjust the threshold voltage level.

Figure 4:
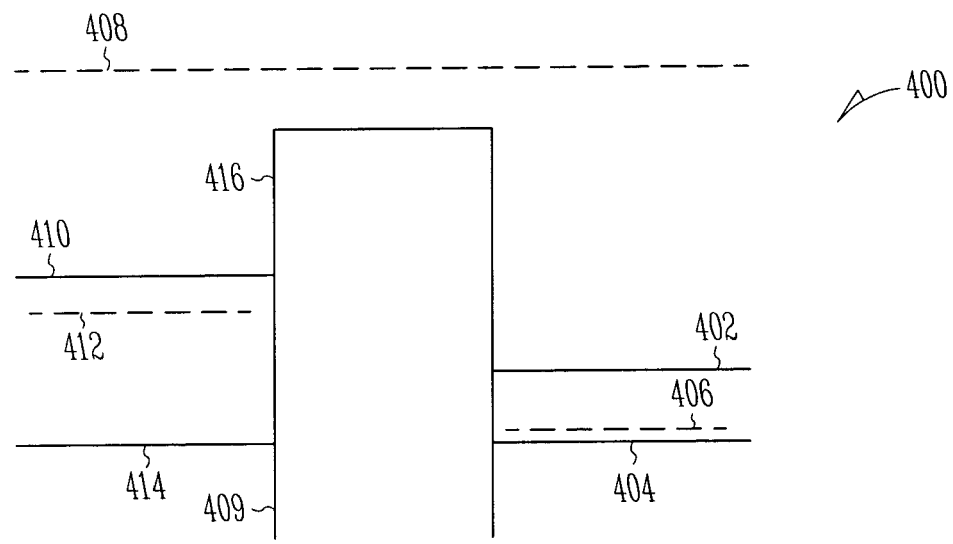
FIG. 4 is an energy band diagram for a silicon carbide gate transistor, according to an embodiment.

FIG. 4 illustrates the band gap diagram 400 for an embodiment of a silicon carbide gate material. There is still a silicon substrate conduction level 402, a silicon substrate valence level 404, and a Fermi level 406 with reference to the vacuum level 408. On the opposite side of the thermally grown silicon dioxide gate oxide 409, the illustrative silicon carbide gate will have a conduction level 410, a Fermi level 412 and a valence level 414, all of which may be different from the values in the case of polysilicon gates. The gate oxide 409 still has the same energy value 416, and electron affinity $\chi$ of the gate oxide, typically 0.9 eV. The band gap for silicon carbide depends upon the ratio of silicon to carbon, and varies from the silicon value of 1.1, as noted above, to the pure carbon value of approximately 4.2 eV. For a silicon carbide mixture, the value of the band gap is about 2.1 eV to 2.6 eV depending upon the percentage of carbon. Since the conduction band is now closer to the vacuum level 408, the electron affinity is lower, about 3.7 eV, and the height of the tunneling barrier is now lower, typically below 2.8 eV, which is lower than the tunneling barrier found in the case of polysilicon of about 3.2 eV. Thus, the tunneling barrier is lowered, and even a small difference in tunneling barrier height causes a large change in tunneling current. For germanium carbide, a very similar band diagram shows a tunneling barrier that extends from a larger value than that of polysilicon for a pure germanium gate of 3.6 eV, to a barrier value that is the same as the polysilicon value of 3.2 eV at a 4% carbon content, to lower values for increased carbon content above the 4% level. The values for silicon, silicon carbide and germanium carbide are discussed in more detail with respect to FIG. 5 later in this disclosure. Increased tunneling current flow at a given erase voltage value results in much faster erase operations and improved EEPROM or flash memory operational speeds.

Crystalline silicon carbide and silicon germanium carbide can be epitaxially grown on a silicon substrate and may be used in both metal oxide semiconductor field effect transistors (MOSFET) or bipolar transistor devices, with the silicon substrate acting as a seed layer for crystal growth. In an embodiment the silicon carbide, germanium carbide and silicon germanium carbide are microcrystalline or amorphous. Such microcrystalline layers or amorphous layers may be grown on insulator layers such as silicon dioxide gate insulator layers, or other insulator layers, by chemical vapor deposition (CVD), laser assisted CVD, plasma CVD, ultra-high vacuum CVD, or sputtering.

Figure 5:
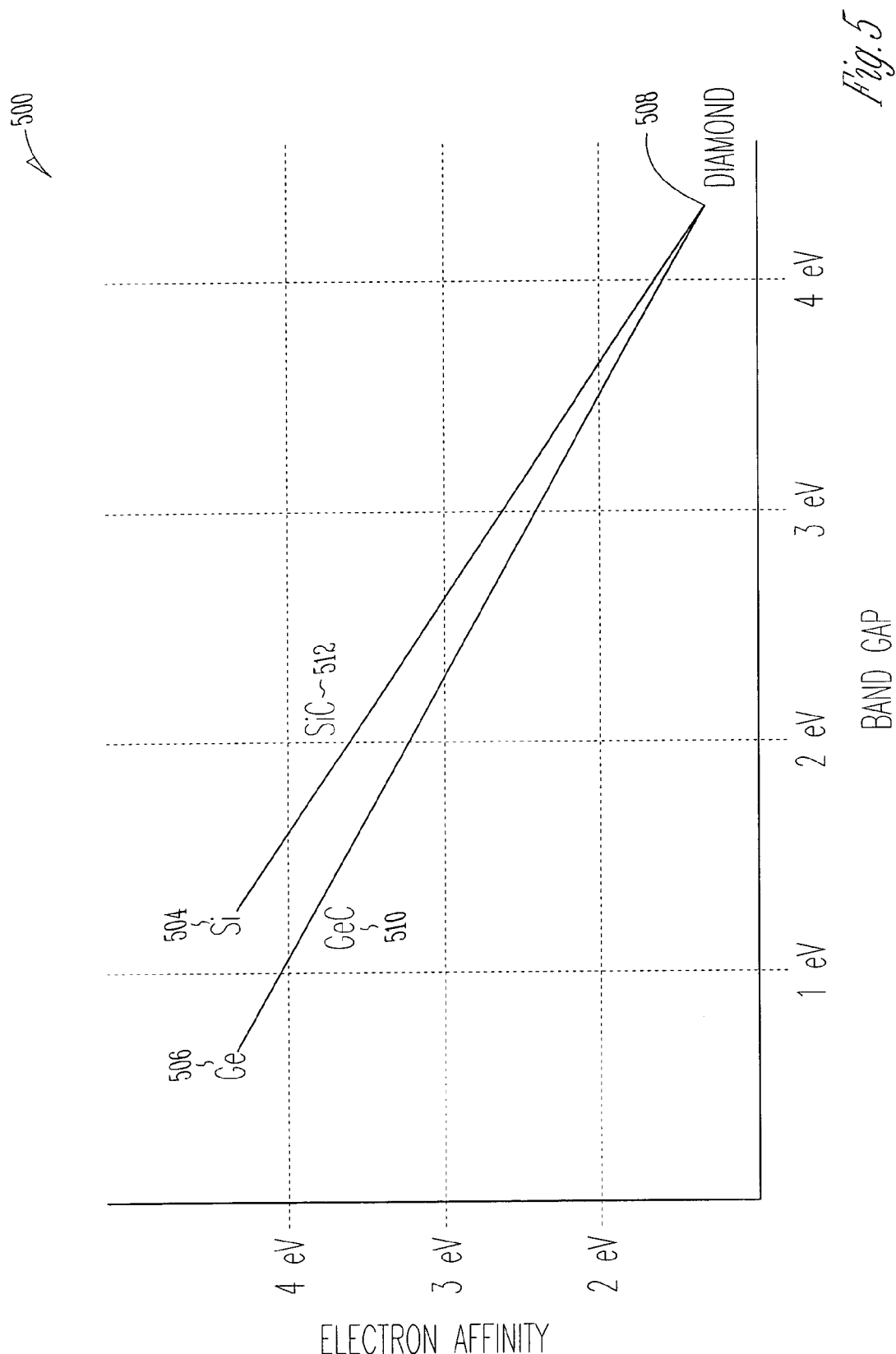
FIG. 5 is a diagram showing bandgap versus electron affinity according to an embodiment.

FIG. 5 is a graph 500 that illustrates the ability to adjust the tunneling barrier height, and thus the tunneling barrier current level, for various embodiments of mixtures of silicon 504, germanium 506, and carbon in the form of diamond 508. The values of germanium carbide of varying percentages of germanium are shown by the line connecting 506 and 508, including the interesting point 510 where a 4% carbon value in germanium provides the same band gap 1.1 eV as pure silicon 504, but with a lower electron affinity $\chi$ and thus improved tunneling currents and faster erase operations without other significant electrical changes in the transistor operation due to changes in the band gap value. Silicon carbide values are projected on the line from 504 to 508, with silicon carbide having a band gap with a 2.1 eV value shown at 512. Various embodiments of the present disclosed methods and devices can be found in the region of the graph between 510 and 512 and the entire area between the lines representing germanium carbide and silicon carbide compositions. An illustrative silicon germanium carbide material with equal amounts of silicon and germanium and varying amounts of carbon would have a band gap to electron affinity χ curve that fits about halfway between the germanium carbide line and the silicon carbide line.

Figure 6:
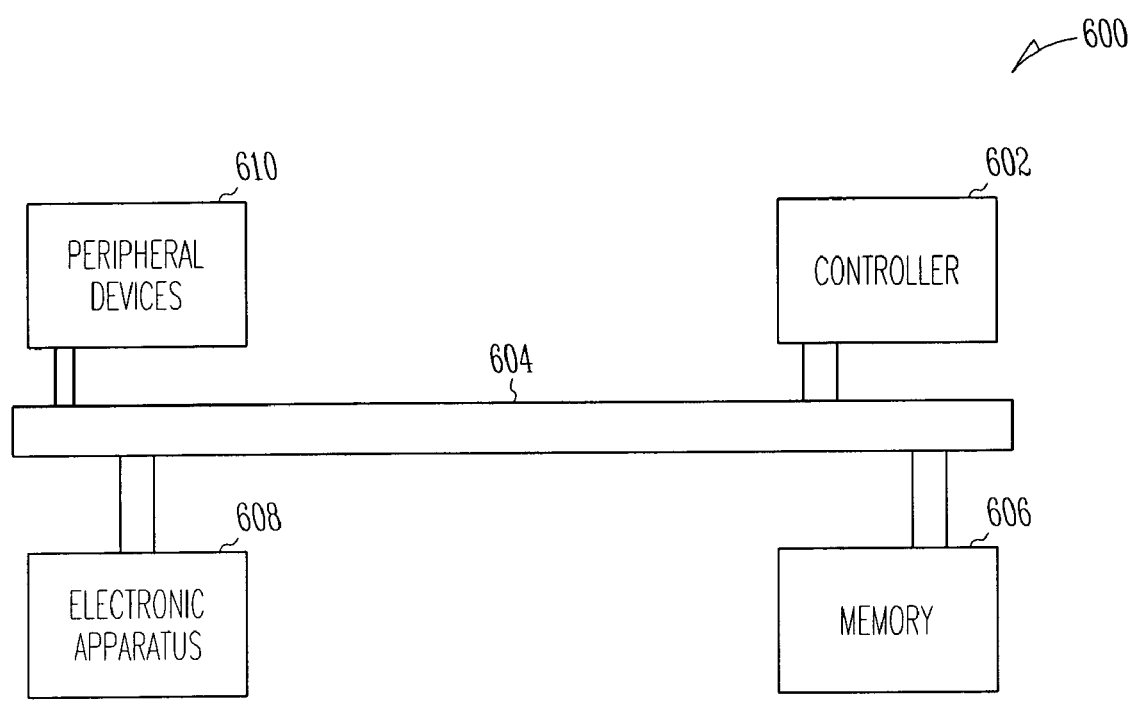
FIG. 6 illustrates a diagram for an embodiment of an electronic system having devices with a floating gate transistor containing a mixture of germanium, silicon and carbon according to an embodiment.

FIG. 6 depicts a diagram of an embodiment of a system 600 having a controller 602 and a memory 606. Controller 602 and/or memory 606 include a transistor having a gate electrode made of a mixture of germanium, silicon and carbon. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. Electronic apparatus 608 may include, but is not limited to, information handling devices, wireless systems, telecommunication systems, fiber optic systems, electro-optic systems, and computers. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a gate electrode formed of a mixture of silicon, germanium and carbon in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the embodiments of the present invention should be determined with reference to the appended claims, along with the full scope of equivalents to which such claims are entitled.

What is claimed is:

1. A field effect transistor, comprising:
a substrate having a first doping type and first doping level;
at least one source diffusion region having a second doping type and a second doping level, and at least one drain diffusion region having the second doping type and the second doping level separated from the at least one source diffusion region by a channel region having the first doping type and a third doping level;
a gate insulator having a specified first thickness disposed on the substrate and extending over the entire channel region and at least a portion of the source diffusion region and at least a portion of the drain diffusion region; and
a floating gate electrode disposed over the gate insulator and extending over at least a portion of each of the source and drain diffusion regions, formed of a mixture including at least germanium and carbon, having a first specified percentage of germanium atoms, a second specified percentage of silicon atoms, and a third specified percentage of carbon atoms, the specified first, second and third percentage selected to obtain at least a desired tunneling current at a desired voltage;
an inter-gate insulator having a specified second thickness disposed over the floating gate; and
a control gate disposed over the inter-gate insulator and substantially separated from the substrate by the inter-gate insulator and the floating gate, and substantially the entirety of the floating gate.

2. The field effect transistor of claim 1, wherein the first percentage of germanium is about 96%, the second percentage of silicon is about 0%, and the third percentage of carbon is about 4%, forming germanium carbide having a band gap of approximately 1.1 eV.

3. The field effect transistor of claim 1, wherein the first percentage of germanium is 25%, the second percentage of silicon is 25%, and the third percentage of carbon is 50%, forming germanium silicon carbide.

4. The field effect transistor of claim 1, wherein the first percentage of germanium, the second percentage of silicon and the third percentage of carbon are selected to form a germanium-silicon carbide having a band gap greater than 1.1 eV.

5. The field effect transistor of claim 1, wherein the first, second and third percentages are selected to obtain a desired tunneling current through the first thickness of the gate insulator at a preselected voltage, and the gate electrode is micro-crystalline.

6. The field effect transistor of claim 1, wherein the substrate is silicon and the gate insulator is thermally grown silicon dioxide.

7. The field effect transistor of claim 1, wherein the floating gate has no direct electrical connection to the substrate or the control gate.

8. An integrated circuit memory cell, comprising:
a transistor having a source, a drain, a channel region, a floating gate, and a control gate disposed over substantially the entirety of the floating gate; and
the floating gate is formed of a mixture of germanium, silicon and carbon to form a film having at least enough electrical conductivity to redistribute trapped electrons essentially evenly throughout the film.

9. The integrated circuit memory cell of claim 8, wherein the mixture has a percentage of germanium of zero, a percentage of silicon of 50, and a percentage of carbon of 50%, forming silicon carbide.

10. The integrated circuit memory cell of claim 8, wherein the mixture has a percentage of germanium of 50%, a percentage of silicon of zero, and a percentage of carbon of 50%, forming germanium carbide.

11. The integrated circuit memory cell of claim 8, wherein the mixture has a percentage of germanium of 25%, a percentage of silicon of 25%, and a percentage of carbon of 50%, forming germanium-silicon carbide.

12. The integrated circuit memory cell of claim 8, wherein the mixture has percentages of germanium, silicon and carbon selected to obtain a desired tunneling current through a gate insulator disposed beneath the floating gate, and the floating gate is micro-crystalline.

13. The integrated circuit memory cell of claim 12, wherein the gate insulator is thermally grown silicon dioxide disposed upon a silicon substrate.

14. The integrated circuit memory cell of claim 12, further comprising an inter-gate insulator disposed between the floating gate and the control gate.

15. The integrated circuit memory cell of claim 14, wherein the memory cell is an electrically erasable programmable read only memory.

16. The integrated circuit memory cell of claim 14, wherein the memory cell is a flash memory.

17. The integrated circuit memory cell of claim 8, wherein the floating gate is doped to increase the electrical conductivity.

18. A memory device, comprising:
a array of memory cells, each of the memory cells comprising:
a source region;
a drain region;
a semiconductive channel region separating the source and drain regions;
a floating gate having a germanium, silicon and carbide composition, disposed adjacent the semiconductive channel region and separated therefrom by a first insulating layer, the germanium having a specified first percentage, the silicon having a specified second percentage, and the carbide having a specified third percentage selected to obtain at least a desired tunneling current at a desired voltage; and
a control gate disposed over substantially the entirety of the floating gate and separated therefrom by a second insulating layer, the control gate coupled to a word line;
addressing circuitry for addressing the array of memory cells; and
control circuitry for controlling read and write operations of the memory device.

19. The memory device of claim 18, wherein the memory device is an electrically erasable programmable read only memory.

20. The memory device of claim 18, wherein the memory device is a flash memory.

21. The memory device of claim 18, further comprising the floating gate film having percentages of germanium, silicon and carbon selected to obtain a desired current flow through the first insulating layer.

22. The memory device of claim 21, wherein the floating gate film is formed of half germanium carbide and half silicon carbide.

23. The memory device of claim 21, wherein the source region, the drain region and the semiconductive channel region are portions of a silicon substrate.

24. The memory device of claim 23, wherein the first insulator is thermally grown silicon dioxide disposed upon the silicon substrate.

25. The memory device of claim 18, further comprising the floating gate being electrically isolated from electrical signals, ground potentials and power potentials, and capable of long term unpowered storage of electrons injected from the channel during periods in which the control gate has a large positive potential applied, and capable of ejecting the stored electrons during periods in which the control gate has a large negative potential applied, and the floating gate is one of micro-crystalline and amorphous in composition, and conductive.

* * * * *